United States Patent
Inoue

(10) Patent No.: US 10,454,249 B2
(45) Date of Patent: Oct. 22, 2019

(54) SEMICONDUCTOR LASER DEVICE

(71) Applicant: SHARP KABUSHIKI KAISHA, Sakai, Osaka (JP)

(72) Inventor: Tomoya Inoue, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/147,720

(22) Filed: Sep. 29, 2018

(65) Prior Publication Data

US 2019/0123514 A1 Apr. 25, 2019

(30) Foreign Application Priority Data

Oct. 24, 2017 (JP) ................. 2017-205200

(51) Int. Cl.
*H01S 5/32* (2006.01)
*H01S 5/22* (2006.01)
*H01S 5/343* (2006.01)

(52) U.S. Cl.
CPC .......... *H01S 5/2228* (2013.01); *H01S 5/2209* (2013.01); *H01S 5/3436* (2013.01); *H01S 5/34353* (2013.01)

(58) Field of Classification Search
CPC ............................ H01S 5/3213; H01S 5/2202
See application file for complete search history.

(56) References Cited

U.S. PATENT DOCUMENTS 5,889,805 A * 3/1999 Botez ............. B82Y 20/00
372/45.01
9,444,224 B2 * 9/2016 Chua ................ H01S 5/30

FOREIGN PATENT DOCUMENTS

JP 2010-182795 A 8/2010

* cited by examiner

*Primary Examiner* — Michael Carter
(74) *Attorney, Agent, or Firm* — ScienBiziP, P.C.

(57) ABSTRACT

In a semiconductor laser device, a n-type cladding layer, a multi-quantum well active layer, and a p-type cladding layer are sequentially laminated on an n-type substrate, and a stripe structure is provided on this semiconductor laminated section. The n-type cladding layer has a first n-type cladding layer configured of $Al_{x1}Ga_{1-x1}As$ ($0.4 < x1 \leq 1$), and a second n-type cladding layer configured of $(Al_{x2}Ga_{1-x2})_{1-y2}In_{y2}P$ ($0 \leq x2 \leq 1$, $0.45 \leq y2 \leq 0.55$). The p-type cladding layer is configured of $(Al_{x3}Ga_{1-x3})_{1-y3}In_{y3}P$ ($0 \leq x3 \leq 1$, $0.45 \leq y3 \leq 0.55$). The width of the stripe structure is 10 μm or more, and the refractive index with respect to the laser oscillation wavelength of the first n-type cladding layer is less than or equal to the refractive index with respect to the laser oscillation wavelength of the second n-type cladding layer.

5 Claims, 9 Drawing Sheets

SEMICONDUCTOR LASER DEVICE

BACKGROUND

1. Field

The present disclosure relates to a semiconductor laser device that emits multi-mode laser light.

2. Description of the Related Art

Semiconductor laser devices are used in various applications such as optical communications, manufacturing, and medical care in industrial use, and such as optical discs in consumer use. As a laser light source that requires a high optical output such as an excitation light source for a fiber laser used for processing or a light source for a laser projector, an end-face emission type semiconductor laser device that oscillates high-order horizontal transverse multi-mode light of a first order or higher is often used. This type of semiconductor laser device generally has a stripe width of 10 µm to several 100 µm, is capable of emitting light of several 100 mW or more, and is referred to as a wide stripe laser, a broad area laser, or the like (hereinafter, simply referred to as a wide stripe laser).

A wide stripe laser is driven by means of a large pulse current, and is thereby capable of emitting short-pulse laser light of a high output having a peak optical output of several 10 W or more. This is because pulse driving results in it being possible for high-output light to be emitted momentarily, suppressing the accumulation of heat to a greater extent compared to continuous driving. This kind of high-output pulse laser can be used as a light source for a sensing system, such as a distance measurement sensor for LiDAR (light detection and ranging) or the like.

A wide stripe laser that emits high-output laser light is driven, albeit momentarily, by an injection of a large current of several 100 mA to several 10 A. In this case, since the injected current is large, power loss increases if the electric resistance of an epitaxial layer is large. Furthermore, there are concerns regarding problems such as the wall-plug efficiency (WPE) declining, or the optical output saturating due to high temperatures caused by heat generation and the device lifespan shortening.

As a structure that suppresses a decline in efficiency during high-temperature operations in a semiconductor laser device, using AlGaInP instead of AlGaAs for the material of a cladding layer that surrounds an active layer has been proposed in the past as disclosed in Japanese Unexamined Patent Application Publication No. 2010-182795, for example. AlGaInP is a material that has a large band gap compared to AlGaAs, and therefore a large band gap difference between the active layer and the cladding layer can be obtained, and carrier overflow can be suppressed. Thus, there is considered to be an improvement in the wall-plug efficiency during high-temperature operations and high-output driving.

SUMMARY

However, AlGaInP has a high electrical resistivity compared to AlGaAs due to the material properties thereof. The resistance of the cladding layer is series resistance that is additionally added to the resistance of the active layer, and, in particular, causes a large power loss when a semiconductor laser is driven by means of a large current. Consequently, in the aforementioned high-output laser, in a case where an AlGaInP cladding layer is used to obtain satisfactory high-temperature characteristics, there has been an issue in that it becomes difficult to also establish a low-voltage operation.

FIG. 8 is a perspective view schematically depicting this kind of conventional end-face emission type of semiconductor laser device 80. This semiconductor laser device 80 is provided with an n-type electrode 801 and a p-type electrode 810, and has an n-type cladding layer 803, a quantum well active layer 804, a p-type cladding layer 806, and a p-type GaAs contact layer 807 laminated in succession on an n-type GaAs substrate 802. A ridge section 808 is formed in a portion of a p-type semiconductor layer 805, and an insulating film 809 is provided on the outer sides of the ridge section 808. The p-type electrode 810, which is for obtaining electrical contact with the p-type semiconductor layer 805, is provided on the insulating film 809.

An injected current becomes constricted in only a stripe-shaped opening having a stripe width w, and the carrier density desirable for oscillation can be obtained. In this structure, the refractive index of the ridge section 808 becomes effectively higher than outside of the ridge section, and therefore optical confinement in the horizontal direction caused by a real refractive index difference is achieved (a real refractive index waveguide structure). In a high-output semiconductor laser, it is possible to supply a large current with the same current density, and it is also possible to reduce the optical density per unit cross-sectional area. Therefore, the stripe width w is often made to be wide, and is set at 10 µm to several 100 µm in accordance with the target optical output.

FIG. 9 is a perspective view schematically depicting another conventional end-face emission type of semiconductor laser device 90. In the example depicted in FIG. 9, an n-type cladding layer 903, a quantum well active layer 904, and a p-type semiconductor layer 905 (a p-type cladding layer 906 and a p-type GaAs contact layer 907) are laminated in succession on a n-type electrode 901 and an n-type GaAs substrate 902. A configuration is adopted in which the p-type semiconductor layer 905 is not provided with a ridge section, and a portion of an insulating film 908 formed on the upper face of the p-type semiconductor layer 905 is removed in a stripe shape.

In this case, the current is injected being restricted to only a region where contact is made between the p-type semiconductor layer 905 remaining in the stripe region and a p-type electrode 909. Since there is no a ridge section, optical confinement in the horizontal direction caused by a real refractive index difference does not occur. However, only the stripe region into which current is injected has a high optical gain. Therefore, light is selectively guided along the stripe region, and optical confinement in the horizontal direction is achieved (a gain waveguide structure).

In these kinds of conventional semiconductor laser devices, in a case where there is an AlGaInP cladding layer and the stripe width w is 10 µm or more, establishing both high temperature stability and a reduction in the operating voltage, and, in particular, improving wall-plug efficiency during high-temperature operations and high-output operations have been considerable issues.

The present disclosure has been devised with consideration being given to the aforementioned issues, and provides a semiconductor laser device in which both high temperature stability and a reduction in the operating voltage are established, and, in particular, there is an improvement in wall-plug efficiency during high-temperature operations and high-output operations.

The present inventor carried out a diligent investigation into reducing the operating voltage of a wide stripe laser having an AlGaInP cladding layer, and discovered that the aforementioned issues may be resolved by means of a structure such as that described hereinafter.

Specifically, a device of the present disclosure that may resolve the aforementioned issues is based on the premise of a semiconductor laser device which has an n-type substrate and a semiconductor laminated section having an n-type cladding layer, an active layer, and a p-type cladding layer sequentially laminated on the n-type substrate, and which is provided with a stripe structure on an upper section of the semiconductor laminated section. This semiconductor laser device is provided with, as the n-type cladding layer, a first n-type cladding layer configured of an $Al_{x1}Ga_{1-x1}As$ layer ($0.4 < x1 \leq 1$), at the side distant from the active layer, and a second n-type cladding layer configured of an $(Al_{x2}Ga_{1-x2})_{1-y2}In_{y2}P$ layer ($0 \leq x2 \leq 1$, $0.45 \leq y2 \leq 0.55$), at the side near to the active layer. Furthermore, the p-type cladding layer is an $(Al_{x3}Ga_{1-x3})_{1-y3}In_{y3}P$ layer ($0 \leq x3 \leq 1$, $0.45 \leq y3 \leq 0.55$). Furthermore, a configuration is adopted in which the width of the stripe structure is 10 µm or more, and the refractive index with respect to the laser oscillation wavelength of the first n-type cladding layer is less than or equal to the refractive index with respect to the laser oscillation wavelength of the second n-type cladding layer.

DESCRIPTION OF THE EMBODIMENTS

Hereinafter, semiconductor laser devices according to embodiments of the present disclosure will be described with reference to the drawings.

First Embodiment

Figure 1:
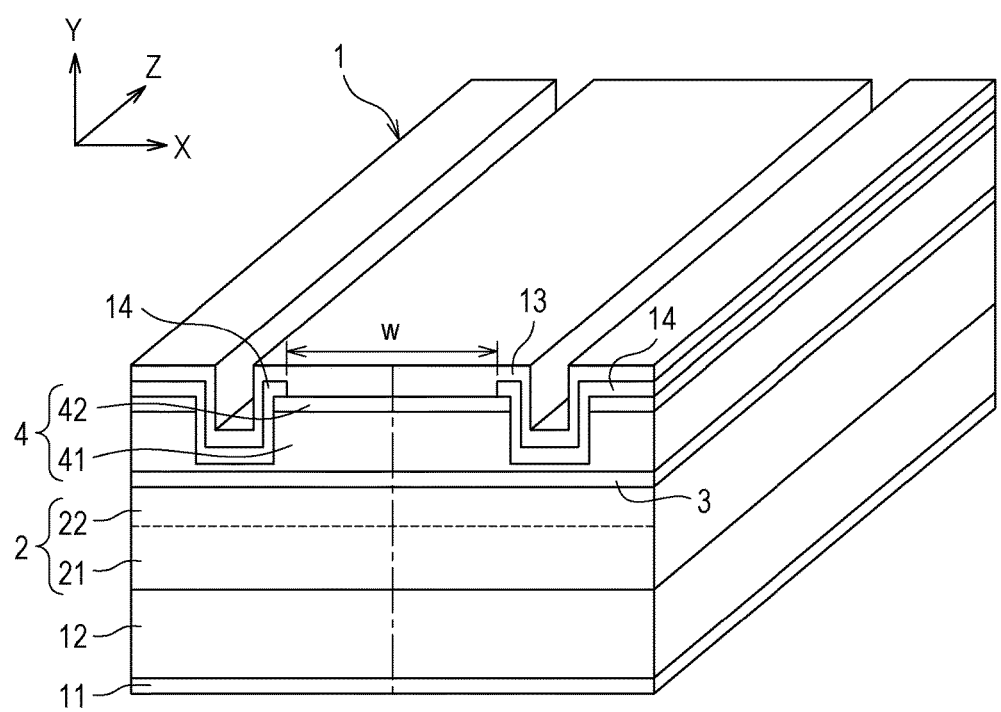
FIG. 1 is a perspective view schematically depicting a layered structure of a semiconductor laser device according to a first embodiment of the present disclosure.

FIG. 1 is a perspective view schematically depicting a layered structure of a semiconductor laser device according to a first embodiment of the present disclosure. In the description hereinafter, the directions in a semiconductor laser device 1 will be described based on the X direction, Y direction, and the Z direction depicted in FIG. 1. Furthermore, hatching for indicating cross sections has been omitted in the drawings described hereinafter to make the drawings easier to understand.

The semiconductor laser device 1 is formed by cleaving a flat sheet-like wafer, has an n-type electrode 11 and a p-type electrode 13, and is provided with a resonator at an end face in the Y direction. This semiconductor laser device 1 is obtained by an n-type cladding layer 2, a multi-quantum well active layer 3, and a p-type semiconductor layer 4 being sequentially epitaxially grown on an n-type substrate 12 configured of n-type GaAs.

The n-type cladding layer 2 is provided with a first n-type cladding layer 21 configured of n-type $Al_{x1}Ga_{(1-x1)}As$, at the side distant from the multi-quantum well active layer 3, and is provided with a second n-type cladding layer 22 configured of n-type $(Al_{x2}Ga_{(1-x2)})_{(1-y2)}In_{y2}P$, at the side near to the multi-quantum well active layer 3.

A p-type cladding layer 41 and a p-type GaAs contact layer 42, which is for obtaining electrical contact, are provided as the p-type semiconductor layer 4. The p-type cladding layer 41 is formed of p-type $(Al_{x3}Ga_{(1-x3)})_{(1-y3)}In_{y3}P$.

The multi-quantum well active layer 3 is a light-emitting layer configured with quantum well layers and barrier layers being laminated in an alternating manner and the quantum well layers being separated by the barrier layers, and, although not depicted in detail, has a multiple-quantum well (MQW) structure.

In the semiconductor laser device 1, the multi-quantum well active layer 3 can emit red (a wavelength of 600 nm) to infrared (a wavelength of 1100 nm) laser light, for example, by appropriately altering the layer thicknesses and compositions of the quantum well layers and the barrier layers.

In an example configuration of a multi-quantum well active layer, GaAs is used for the quantum well layers and AlGaAs is used for the barrier layers. In this case, the multi-quantum well active layer 3 can emit infrared light having a wavelength of 830 nm.

Furthermore, for example, by configuring a quantum well active layer using GaInP for the quantum well layers and using AlGaInP for the barrier layers, the multi-quantum well active layer 3 can emit red light having a wavelength of 660 nm.

In addition, for example, in a case where a configuration is adopted in which InGaAs is used for the quantum well layers and AlGaAs is used for the barrier layers, the multi-quantum well active layer 3 can emit infrared light having a wavelength of 905 nm.

Figure 2:
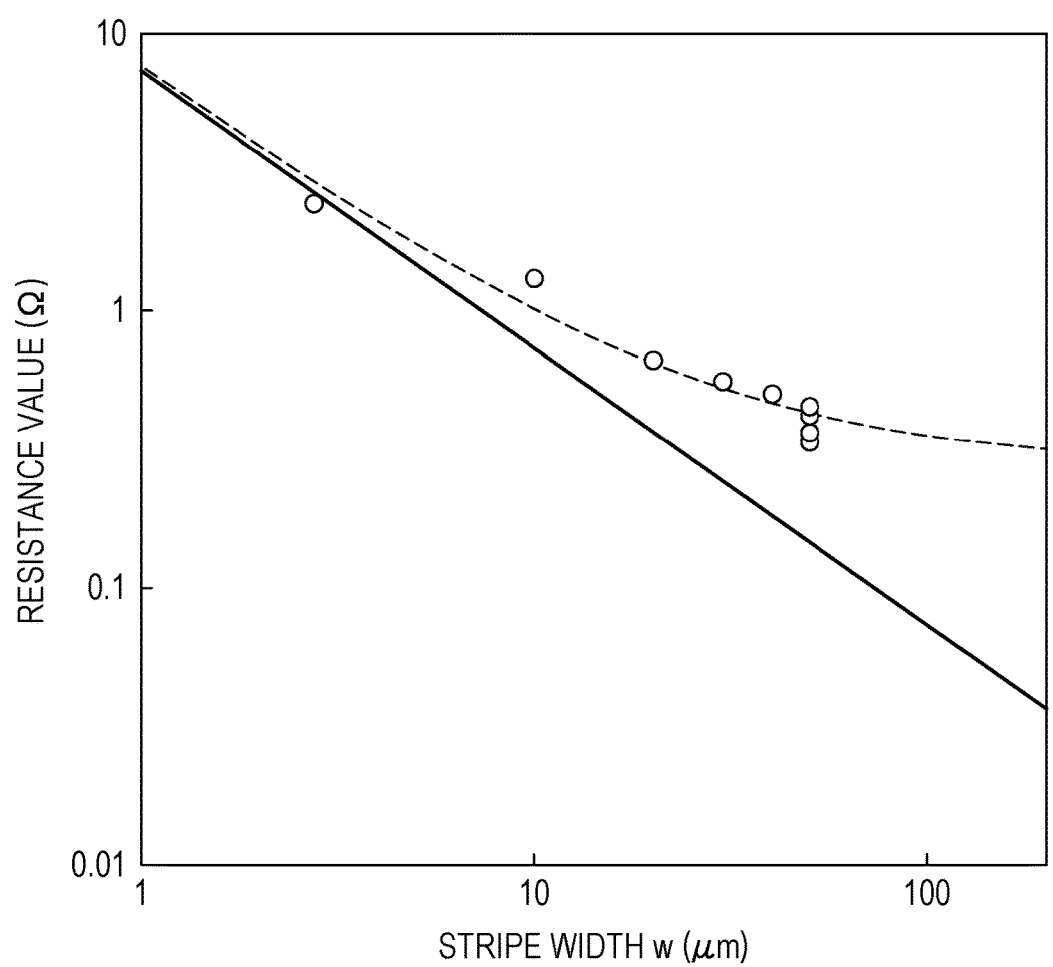
FIG. 2 is a graph depicting experiment results for device resistance of a wide stripe laser having a conventional AlGaInP cladding layer.

FIG. 2 is a graph depicting experiment results for device resistance of a conventional wide stripe laser having an AlGaInP cladding layer, according to the investigation of the present inventor. In the drawing, the horizontal axis indicates the stripe width w and the vertical axis indicates a resistance value (Ω) for series resistance (on-resistance).

As indicated by the solid line in the drawing, ideally, the resistance values are inversely proportional to area, and therefore a reduction in the operating voltage may be expected by increasing the stripe width w. However, according to the investigation of the present inventor, it was confirmed that there is a problem in that when the stripe width w becomes greater than 10 µm, the decrease in the resistance values gradually saturates as indicated by the dashed line in the drawing.

This is liable to not only cause a decline in the wall-plug efficiency but also lead to a temperature increase near the active layer due to the device itself generating heat caused by series resistance. In other words, the overflow suppressing effect expected in the AlGaInP cladding layer is negated, which is considered to be a factor that inhibits an increase in the efficiency of a wide stripe laser.

On the basis of these experiment results and as a result of a diligent investigation, the present inventor clarified that electric resistance increases from an ideal value due to causes such as those given hereinafter, in a wide stripe laser having a stripe width w of 10 μm or more and an AlGaInP cladding layer.

Specifically, in a single transverse mode end-face emission type semiconductor laser device that is made on an n-type GaAs substrate, a stripe having a width of the order of several μm is formed in at least a portion of a p-type semiconductor layer that includes a p-type cladding layer. An n-type semiconductor layer generally does not form a stripe, and has a width of 100 μm to several 100 μm. The width of a p-type semiconductor layer is several 10 times to several 100 times greater than the width of the n-type semiconductor layer, and therefore device resistance is governed mostly by the resistance of the p-type semiconductor layer. Consequently, in a case where the resistivity of the p-type semiconductor layer is the same, it is possible to obtain ideal characteristics in which device resistance decreases in a manner that is inversely proportional to stripe width w.

However, a stripe width w of 10 μm or more is used in a wide stripe laser, and therefore the width of the p-type semiconductor layer becomes a value that is close to the width of the n-type semiconductor layer. As a result, the proportion of the contribution of the n-type semiconductor layer becomes large with respect to the total resistance value. That is, it is thought that the resistance of the n-type semiconductor layer that could be ignored with a single transverse mode laser having a stripe width w of less than 10 μm is not able to be ignored in a wide stripe laser, and a high value is reached that is beyond the aforementioned ideal value.

In particular, the aforementioned problem becomes prominent in a case where an AlGaInP cladding layer is provided. AlGaInP has the features of having a high resistivity due to the material properties thereof and also the resistivities of n-type AlGaInP and p-type AlGaInP being close. Therefore, it can be said that the proportion of the contribution of the n-type semiconductor layer is more prominent than with a semiconductor laser device provided with an AlGaAs cladding layer.

From investigations such as the above, it is thought that the resistance value of a wide stripe laser having an AlGaInP cladding layer becomes higher than the ideal value. In order to reduce the resistance value, it is desirable to increase the carrier density or reduce the layer thickness of the n-type semiconductor layer; however, as a trade-off, a deterioration in characteristics occurs such as an increase in internal loss caused by an increase in light absorption in the cladding layer, and an increase in the threshold current caused by a decline in the optical confinement coefficient for the active layer. As a result, in a wide stripe type of semiconductor laser device having an AlGaInP cladding layer, it becomes difficult to establish both high efficiency during high-temperature operations and a reduction in the operating voltage.

Thus, in the semiconductor laser device 1 according to the first embodiment, with respect to the n-type cladding layer 2, in order to control the optical confinement for the multi-quantum well active layer 3, the compositions, layer thicknesses, and the like thereof are adjusted in the manner described hereinafter.

First, an example will be described in which, in the multi-quantum well active layer 3, GaAs is used for the quantum well layers and AlGaAs is used for the barrier layers, and infrared light having an oscillation wavelength Lpnm is emitted.

For the first n-type cladding layer 21, the refractive index thereof is taken as $n_{n1}$ and the layer thickness is taken as $t_{n1}$, for the second n-type cladding layer 22, the refractive index thereof is taken as $n_{n2}$ and the layer thickness is taken as $t_{n2}$, and for the p-type cladding layer 41, the refractive index thereof is taken as $n_p$. Here, the refractive indexes $n_{n1}$, $n_{n2}$, and $n_p$ each represent a value for a refractive index with respect to infrared light having the oscillation wavelength Lpnm.

In n-type $Al_{x1}Ga_{(1-x1)}As$ constituting the first n-type cladding layer 21, the Al composition ratio is taken as $x_1$. In n-type $(Al_{x2}Ga_{(1-x2)})_{(1-y2)}In_{y2}P$ constituting the second n-type cladding layer 22, the Al composition ratio is taken as $x_2$. In p-type $(Al_{x3}Ga_{(1-x3)})_{(1-y3)}In_{y3}P$ constituting the p-type cladding layer 41, the Al composition ratio is taken as $x_3$. The refractive index, the Al composition, and the layer thickness in each of these layers is configured as described hereinafter.

With regard to the relationship between the refractive index $n_p$ of the p-type cladding layer 41 and the refractive index $n_{n2}$ of the second n-type cladding layer 22, the desired laser characteristics can be obtained by setting the values of the Al composition ratio $x_3$ and the Al composition ratio $x_2$ in an arbitrary manner.

With regard to the relationship between the refractive index $n_{n2}$ of the second n-type cladding layer 22 and the refractive index $n_{n1}$ of the first n-type cladding layer 21, the values of the Al composition ratio $x_1$ and the Al composition ratio $x_2$ are selected in such a way that $n_{n2} \geq n_{n1}$.

Figure 3:
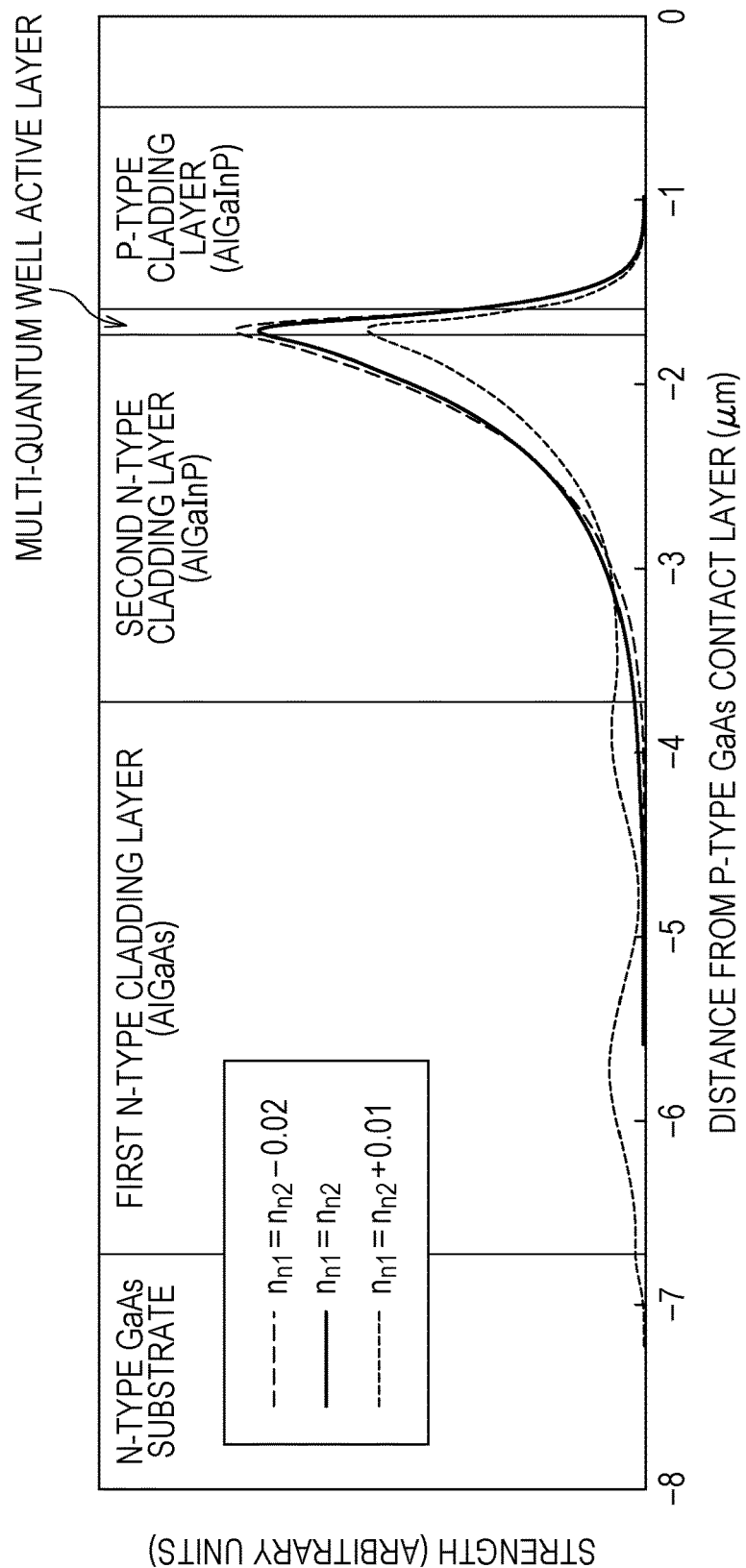
FIG. 3 is a near field pattern of vertical transverse mode light in the semiconductor laser device according to the first embodiment.

FIG. 3 depicts a near field pattern (NFP) of vertical transverse mode light (Y direction light that is perpendicular to the active layer) in the semiconductor laser device 1 according to the first embodiment. In the drawing, the solid line indicates a case where the refractive index $n_{n2}$ of the second n-type cladding layer 22 and the refractive index $n_{n2}$ of the first n-type cladding layer 21 are equal, and the long dashed line indicates a case where the refractive index $n_{n2}$ is greater than the refractive index $n_{n1}$. In these cases, the near field pattern has a unimodal shape having a single peak and a stable mode is obtained.

In FIG. 3, the short dashed line indicates a case where the refractive index $n_{n2}$ of the second n-type cladding layer 22 is less than the refractive index $n_{n1}$ of the first n-type cladding layer 21 (a case where $n_{n2} < n_{n1}$). In this case, the near field pattern does not have a unimodal shape having a single peak. This is because a portion of the vertical transverse mode light is confined and guided to the region of the first n-type cladding layer 21. Together with this, there are a plurality of peaks also in the far field pattern (FFP) and the emission angle becomes wide, and therefore the desired laser characteristics are not obtained.

Here, the refractive index $n_p$ of the p-type cladding layer 41 may be less than the average refractive index of the n-type cladding layer 2 with thickness having been taken into consideration. In other words, the average refractive index of the n-type cladding layer 2 is represented by the following formula.

$$\{(n_{n1} \times t_{n1}) + (n_{n2} \times t_{n2})\}/(t_{n1} + t_{n2})$$

Consequently, the refractive index $n_p$ of the p-type cladding layer 41 may satisfy the relationship of the following formula (1).

$$n_p < [\{(n_{n1} \times t_{n1}) + (n_{n2} \times t_{n2})\}/(t_{n1}+t_{n2})] \quad (1)$$

In the p-type cladding layer 41, there is considerable loss due to light absorption. However, in the exemplified embodiment, an asymmetric cladding design is adopted in which guided light is biased and distributed toward the n-type cladding layer 2, and therefore the effusion of guided light to the p-type cladding layer 41 can be reduced. Therefore, differential efficiency in the semiconductor laser device 1 increases, and optical output characteristics particularly improve.

In addition, the layer thickness $t_{n1}$ of the first n-type cladding layer 21 and the layer thickness $t_{n2}$ of the second n-type cladding layer 22 may be configured according to the following relationship.

$$t_{n2} < t_{n1}$$

The first n-type cladding layer 21 is configured of n-type AlGaAs, which has a low resistivity; however, due to the first n-type cladding layer 21 and the second n-type cladding layer 22 having the aforementioned layer thickness relationship, the proportion occupied by the first n-type cladding layer 21 in the entire n-type cladding layer 2 increases, and it becomes possible to obtain a resistance value reduction effect.

Furthermore, within the n-type cladding layer 2, the second n-type cladding layer 22 is configured of n-type $(Al_{x2}Ga_{(1-x2)})_{(1-y2)}In_{y2}P$, and the value of $y_2$ has a range of greater than or equal to 0.45 and less than or equal to 0.55. In the p-type $(Al_{x3}Ga_{(1-x3)})_{(1-y3)}In_{y3}P$ constituting the p-type cladding layer 41, the value of $y_3$ also has a range of greater than or equal to 0.45 and less than or equal to 0.55.

Due to the values of the In composition ratios $y_2$ and $y_3$ being configured in this manner, it is possible to ensure that lattice mismatching with respect to the n-type substrate (GaAs substrate) 12 does not become large. In the present embodiment, it is desirable for the values of the In composition ratios $y_2$ and $y_3$ to be 0.5, which is the lattice matching condition.

Exemplary configurations for the Al composition ratios, refractive indexes, and layer thicknesses of each of the first n-type cladding layer 21, the second n-type cladding layer 22, and the p-type cladding layer 41 in the semiconductor laser device 1 according to the first embodiment are shown in Table 1.

TABLE 1

| Layer | Material | Al composition ratio | Refractive index | Layer thickness |
|---|---|---|---|---|
| p-type cladding layer | $\{Al_{x3}Ga_{(1-x3)}\}_{0.5}In_{0.5}P$ | $x_3$ 0.70 | $n_p$ 3.17 | — |
| Second n-type cladding layer | $\{Al_{x2}Ga_{(1-x2)}\}_{0.5}In_{0.5}P$ | $x_2$ 0.40 | $n_{n2}$ 3.24 | $t_{n2}$ 2.0 μm |
| First n-type cladding layer | $Al_{x1}Ga_{(1-x1)}As$ | $x_1$ 0.59 | $n_{n1}$ 3.23 | $t_{n1}$ 3.0 μm |

In this example, the semiconductor laser device 1 is provided with a GaAs/AlGaAs multi-quantum well active layer 3 that emits infrared light having an oscillation wavelength of 830 nm.

Furthermore, example configurations for the Al composition ratios, refractive indexes, and layer thicknesses of each of the aforementioned layers in another example of the semiconductor laser device 1 are shown in Table 2. In this example, the semiconductor laser device 1 is provided with a GaAs/AlGaAs multi-quantum well active layer 3 that emits infrared light having an oscillation wavelength of 905 nm.

TABLE 2

| Layer | Material | Al composition ratio | Refractive index | Layer thickness |
|---|---|---|---|---|
| p-type cladding layer | $\{Al_{x3}Ga_{(1-x3)}\}_{0.5}In_{0.5}P$ | $x_3$ 0.50 | $n_p$ 3.17 | — |
| Second n-type cladding layer | $\{Al_{x2}Ga_{(1-x2)}\}_{0.5}In_{0.5}P$ | $x_2$ 0.50 | $n_{n2}$ 3.17 | $t_{n2}$ 1.0 μm |
| First n-type cladding layer | $Al_{x1}Ga_{(1-x1)}As$ | $x_1$ 0.65 | $n_{n1}$ 3.16 | $t_{n1}$ 1.5 μm |

Cases where the oscillation wavelength is 830 nm or 905 nm are shown in Tables 1 and 2; however, the semiconductor laser device 1, in which optimization is possible with respect to each desired wavelength by selecting appropriate values for each of the Al composition ratios $x_1$, $x_2$, and $x_3$ and the layer thicknesses t1 and t2 similar to the case where the oscillation wavelengths are different, is manufactured with each layer being grown by means of a method such as metal organic chemical vapor deposition (MOCVD) or molecular beam epitaxy (MBE) (an epitaxial growth process).

For example, after the epitaxial growth process, an etching process such as patterning by means of photolithography or dry-etching is carried out on a wafer that includes each laminated body and the n-type substrate 12. Thus, a ridge structure having a stripe shape (long narrow shape) is formed in the Z direction in FIG. 1 (a ridge structure forming process). In the ridge structure of the semiconductor laser device 1, the ridge width, which is the width in the X direction, can be appropriately adjusted by changing the photolithography patterning width.

In the semiconductor laser device 1, the stripe width w is 10 μm or more, and is more desirably 20 m or more. An operating voltage reduction effect can thereby be obtained.

Continuing on from the ridge structure forming process, patterning is carried out by means of photolithography or the like and then an insulating film 14 is deposited, in such a way that, out of the p-type semiconductor layer 4 exposed at the epitaxial surface side, the p-type semiconductor layer 4 is exposed only on the ridge structure. Thereafter, the n-type electrode 11 is formed at the n-type substrate 12 side, and the p-type electrode 13 made of Au or the like is formed at the epitaxial surface (the main growth face) side. A real refractive index waveguide type of stripe structure is thereby formed (a stripe structure forming process).

After each process such as the epitaxial growth process, the ridge structure forming process, and the stripe structure forming process, a resonator having a pair of reflective faces is cleaved and formed with a fixed length at the Z direction end face of the wafer. Although not depicted in detail, at this end face, an end face coating film for which a dielectric film is laminated is formed to protect the end face and adjust reflectance.

Here, the cleaving that is carried out in the semiconductor laser device 1 is carried out by means of a dividing method in which cracking is caused in a specific crystal face using the ease with which crystal cracks in a specific direction, and that cracking is made to advance further for divisions to occur. Therefore, in a case where the semiconductor laser device 1 is to be manufactured, division assist grooves (stripe-shaped grooves) or the like are formed in the epitaxial surface (the main growth face), and cracking can thereby be caused in a specific crystal face. The wafer is divided into individual semiconductor laser devices 1 by carrying out chip division by cleaving between each stripe structure.

In this way, the semiconductor laser device 1 is manufactured. In each of the aforementioned manufacturing processes, an example having a ridge structure has been given as the semiconductor laser device 1; however, there is no restriction thereto, and by satisfying the condition of the aforementioned formula (1) and the like, it is possible for a semiconductor laser device with which the aforementioned effects can be obtained to be formed in a similar manner, which is particularly suitable for a semiconductor laser device that emits red to infrared light having an oscillation wavelength of greater than or equal to 600 nm and less than or equal to 1100 nm.

Second Embodiment

Figure 4:
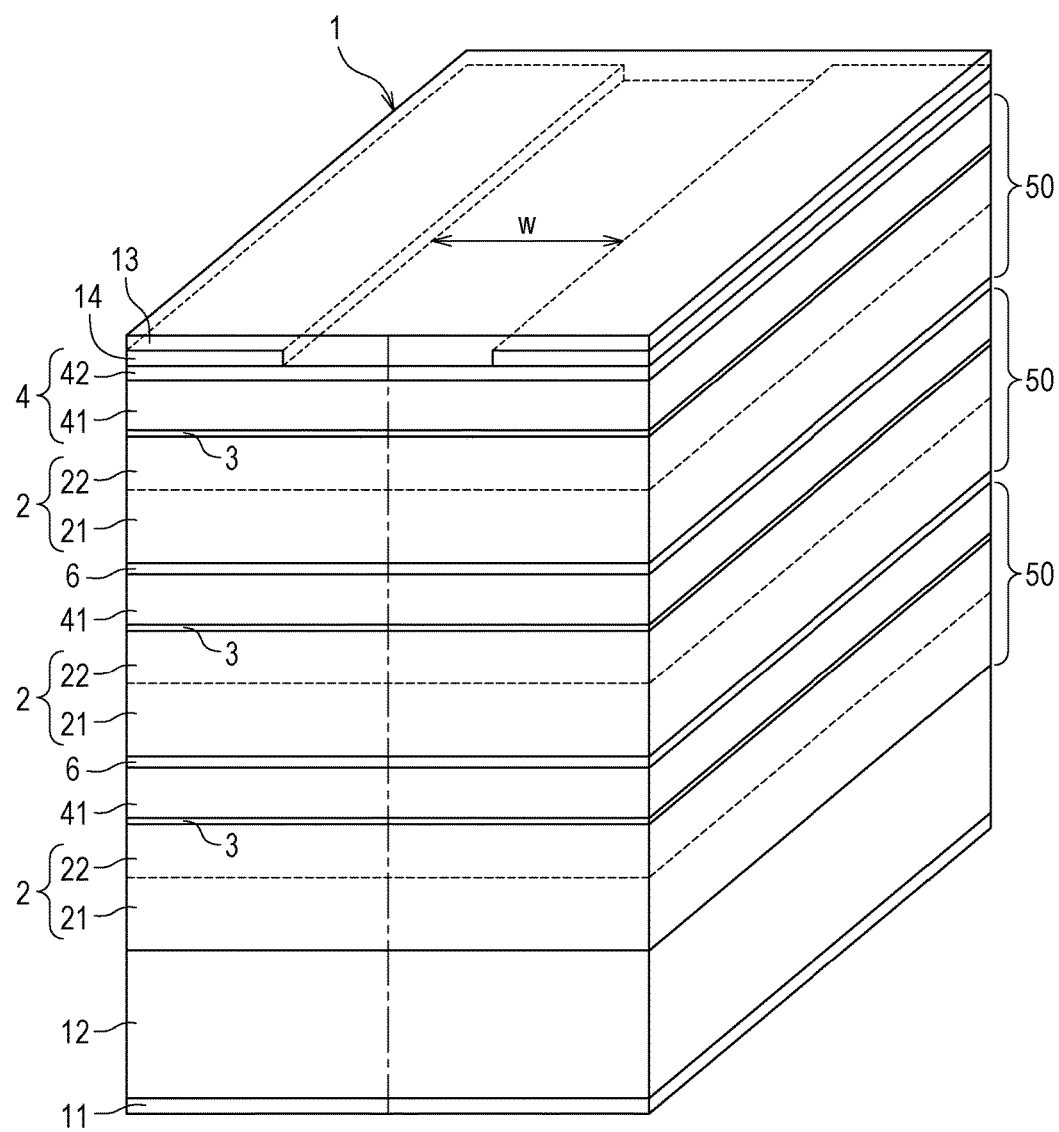
FIG. 4 is a perspective view schematically depicting a layered structure of a semiconductor laser device according to a second embodiment of the present disclosure.

FIG. 4 is a perspective view schematically depicting a layered structure of the semiconductor laser device 1 device according to a second embodiment.

This semiconductor laser device 1 has a similar configuration to that of the first embodiment, in which the n-type cladding layer 2, the multi-quantum well active layer 3, and the p-type cladding layer 41 are provided in succession on the n-type substrate 12 configured of n-type GaAs. The n-type cladding layer 2 is provided with the first n-type cladding layer 21 configured of n-type AlGaAs, and the second n-type cladding layer 22 configured of n-type AlGaInP. The compositions of these layers have similar features to those of the first embodiment.

In addition, in the present embodiment, a configuration is adopted where a unit laser structure 50 having the n-type cladding layer 2, the multi-quantum well active layer 3, and the p-type cladding layer 41 laminated in succession therein is provided in plurality, and a tunnel junction layer 6 is provided in boundary regions between the unit laser structures 50. The semiconductor laser device 1 is formed with the unit laser structures 50 being laminated in plurality in the direction perpendicular to the growth face of the n-type substrate 12. The p-type GaAs contact layer 42 is laminated on the uppermost section of the plurality of unit laser structures 50.

In the exemplified embodiment, the semiconductor laser device 1 is configured with a set of three unit laser structures 50 being laminated with the tunnel junction layers 6 interposed. Due to a plurality of the unit laser structures 50 being laminated with the tunnel junction layers 6 interposed, the laser emission output becomes the sum of the output of each layer, and therefore an even higher optical output can be obtained compared to the case of a single configuration in which the unit laser structures 50 are not laminated.

A ridge structure is not formed on the wafer after the epitaxial growth process, and patterning is carried out leaving a stripe-shaped region to thereby form the insulating film 14 and the p-type electrode 13. A gain waveguide type of stripe structure is thereby formed. The stripe structure is not restricted to the structure depicted in FIG. 4, and any other stripe structure may be adopted.

After the stripe structure forming process, cleaving, the forming of an end face coating film, and chip division are carried out by means of similar methods to those of the first embodiment, and the semiconductor laser device 1 is thereby made.

In the semiconductor laser device 1 configured as mentioned above, it becomes possible for high-output laser light to be emitted at a high wall-plug efficiency from room temperature to high temperatures. The second n-type cladding layer 22 configured of AlGaInP has the effect of suppressing carrier overflow from the multi-quantum well active layer 3 and improving efficiency during high-temperature operations. The first n-type cladding layer 21 configured of AlGaAs has the effect of reducing the operating voltage. Consequently, it is possible to reduce the operating voltage of the semiconductor laser device 1, which is a wide stripe laser that has an AlGaInP cladding layer.

The resistivity of n-type AlGaAs is approximately 10 times lower than that of p-type AlGaAs having the same carrier density, and therefore it becomes possible to lower the resistance value even in a case where the layer thickness is high. Furthermore, by making the layer thickness of the second n-type cladding layer 22 less than that of the first n-type cladding layer 21, the proportion occupied by the layer thickness of the n-type AlGaAs having a low resistivity in the layer thickness of the entire n-type cladding layer 2 increases, and it becomes possible to more effectively obtain a resistance value reduction effect.

The semiconductor laser device 1 according to the second embodiment is suitable as a stack type of end-face emission type semiconductor laser device in which the unit laser structure 50, which includes the p-type cladding layer 41, the multi-quantum well active layer 3, and the n-type cladding layer 2, has been laminated in plurality with the tunnel junction layer 6 interposed.

The refractive index of the first n-type cladding layer 21 with respect to the oscillation wavelength is adjusted to be less than the refractive index of the second n-type cladding layer 22. It is thereby possible for the semiconductor laser device 1 to emit laser light having a unimodal vertical far field pattern.

Example 1

Figure 5:
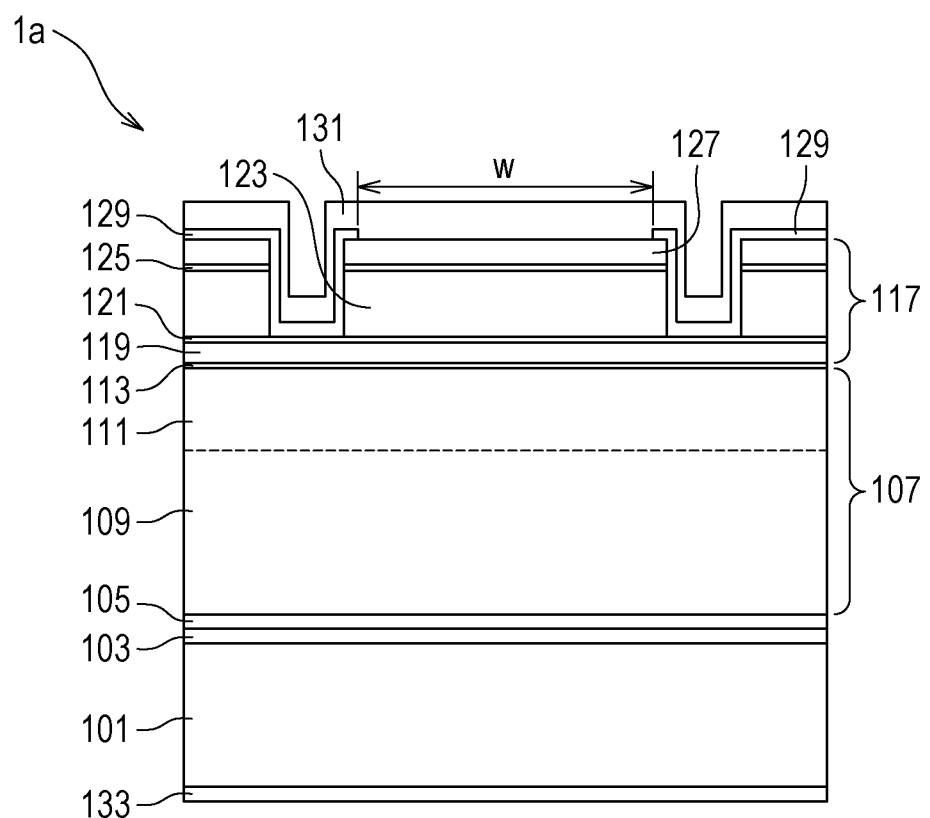
FIG. 5 is a cross-sectional structural view of a semiconductor laser device according to example 1.

FIG. 5 is a cross-sectional structural view of a semiconductor laser device 1a according to example 1.

In this example, an n-type GaAs buffer layer 103 and an n-type $Al_{0.25}Ga_{0.75}As$ buffer layer 105 are deposited on an n-type electrode 133 and an n-type GaAs substrate 101 by means of the MOCVD method. In addition, as an n-type cladding layer 107, a first n-type cladding layer 109 configured of n-type $Al_{0.59}Ga_{0.41}As$ that is 3-μm thick and a second n-type cladding layer 111 configured of n-type $(Al_{0.40}Ga_{0.60})_{0.50}In_{0.50}P$ that is 2-μm thick, a GaAs/AlGaAs multi-quantum well active layer 113, a first p-type cladding layer 119 configured of p-type $(Al_{0.70}Ga_{0.30})_{0.50}In_{0.50}P$ that is 150-nm thick, an etching stop layer 121 configured of undoped $Ga_{0.5}In_{0.5}P$, a second p-type cladding layer 123 configured of p-type $(Al_{0.70}Ga_{0.30})_{0.50}In_{0.50}P$ that is 800-nm thick, a p-type $Ga_{0.50}In_{0.50}P$ intermediate layer 125, and a p-type GaAs contact layer 127 are deposited.

Furthermore, patterning is carried out leaving a stripe region having the stripe width w, and an insulating film 129 and a p-type electrode 131 are formed.

The GaAs/AlGaAs multi-quantum well active layer 113 has a double quantum well layer structure made with a 40-nm undoped $Al_{0.50}Ga_{0.50}As$ optical guide layer, a 5-nm GaAs quantum well layer, a 5-nm $Al_{0.50}Ga_{0.50}As$ barrier layer, a 5-nm GaAs quantum well layer, and a 9-nm $Al_{0.50}Ga_{0.50}As$ optical guide layer being sequentially deposited, and is designed in such a way that infrared light having an oscillation wavelength of 830 nm is emitted.

Furthermore, in example 1, a GaInP etching stop layer 121 for stopping etching when a ridge is being formed is provided between the first p-type cladding layer 119 and the second p-type cladding layer 123. This GaInP etching stop layer 121 occupies a small proportion of the layer thickness of the entire p-type cladding layer 117, and therefore the effect on light distribution and current injection is small, and the first p-type cladding layer 119 and the second p-type cladding layer 123 combined can function as the p-type cladding layer 117.

On the wafer after crystal growth, stripe structures having stripe widths w of 10 µm, 20 µm, 50 µm, 100 µm, and 200 µm were formed by means of the method described in the first embodiment, cleaving was carried out at a resonator length of 1100 µm and an end-face protective film was formed, and semiconductor laser devices 1a were made.

Figure 6:
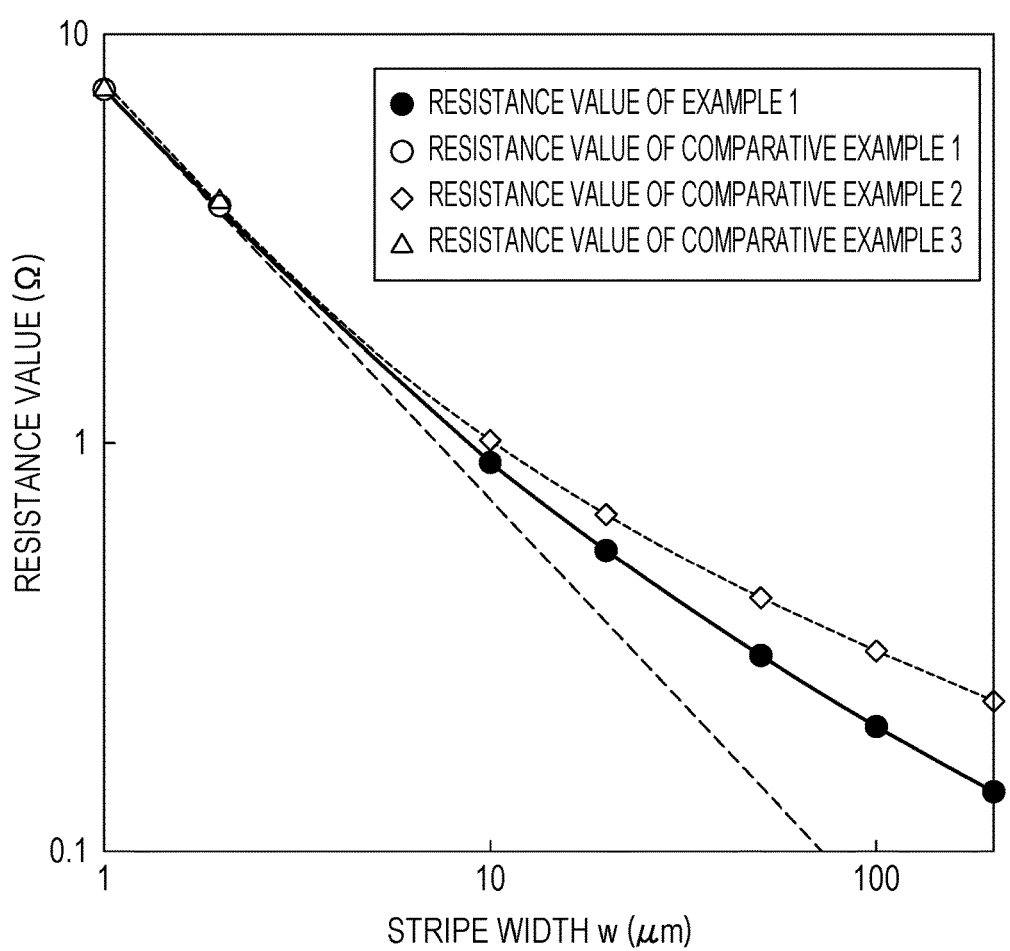
FIG. 6 is a graph depicting device resistance measured with the stripe width being varied, for example 1, comparative example 1, comparative example 2, and comparative example 3.

FIG. 6 is a graph depicting device resistance (resistance value Ω) measured with the stripe width (µm) being varied, for example 1, comparative example 1, comparative example 2, and comparative example 3.

As comparative example 1 for example 1, semiconductor laser devices that operate in a horizontal transverse single mode were made with the stripe width w being 1 µm and 2 µm and the remaining configuration being similar to that of example 1.

Furthermore, as comparative example 2, semiconductor laser devices were made with the composition of the first n-type cladding layer being $(Al_{0.40}Ga_{0.60})_{0.50}In_{0.50}P$, which is the same as that of the second n-type cladding layer, and the remaining configuration being similar to that of example 1.

Furthermore, as comparative example 3, semiconductor laser devices that operate in a horizontal transverse single mode were made with the stripe width w being 1 µm and 2 µm and the composition of the first n-type cladding layer being $(Al_{0.40}Ga_{0.60})_{0.50}In_{0.50}P$, which is the same as that of comparative example 2.

In a case where the stripe width w is 10 µm or more, example 1 (the composition of the first n-type cladding layer being AlGaAs) had a lower resistance value compared to comparative example 2 (the composition of the first n-type cladding layer being AlGaInP).

In a case where the stripe width w is 200 µm, device resistance decreased to approximately 60% compared to a case where the first n-type cladding layer is AlGaInP. However, in a case where the stripe width w is 1 µm and 2 µm, the resistance values were the same in comparative example 1 and comparative example 3, and whether the composition of the first n-type cladding layer is AlGaInP (comparative example 1) or AlGaAs (comparative example 3) was inconsequential.

Consequently, in a semiconductor laser device having the wide stripe structure exemplified in example 1, it becomes possible to achieve an effective reduction in the operating voltage.

Example 2

Figure 7:
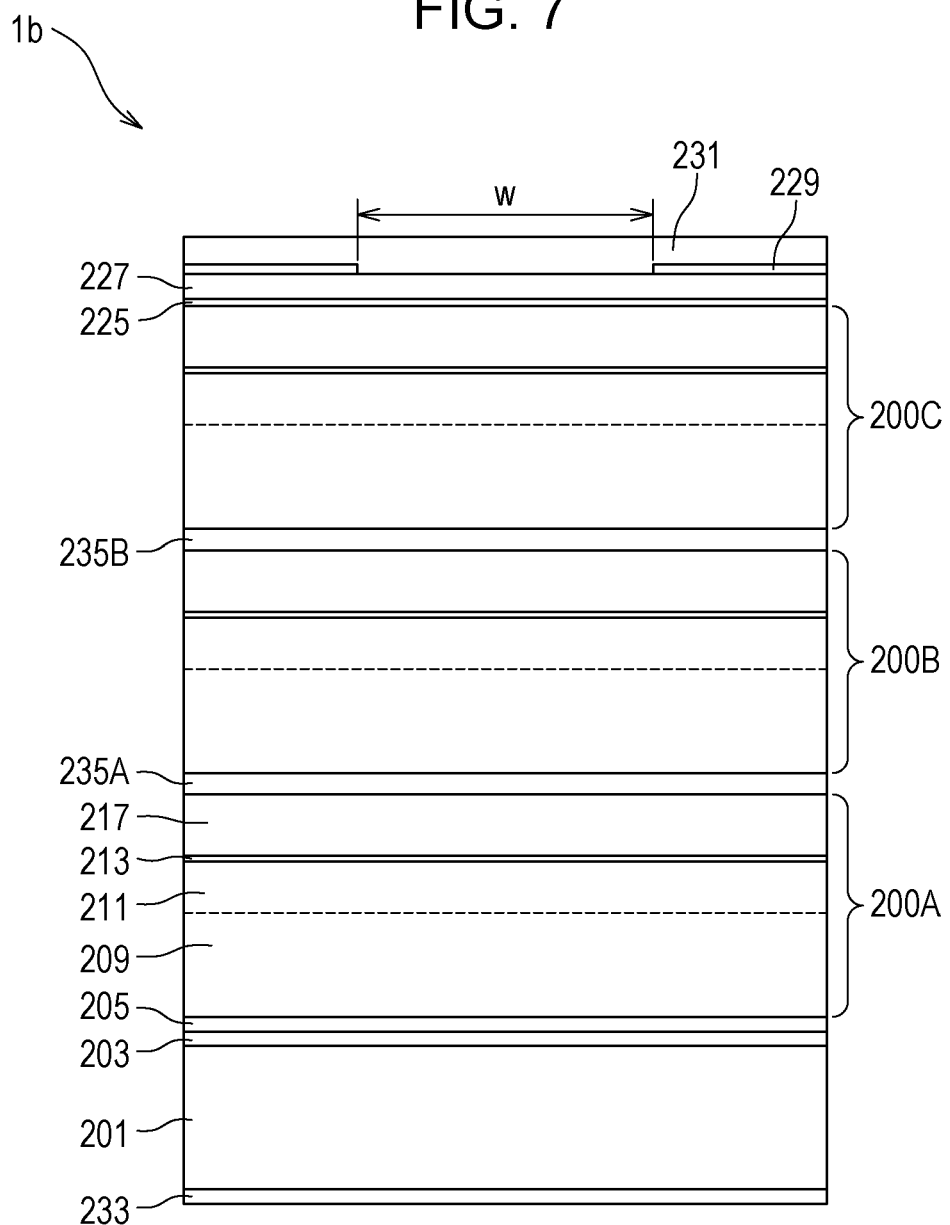
FIG. 7 is a cross-sectional structural view of a semiconductor laser device according to example 2.
Figure 8:
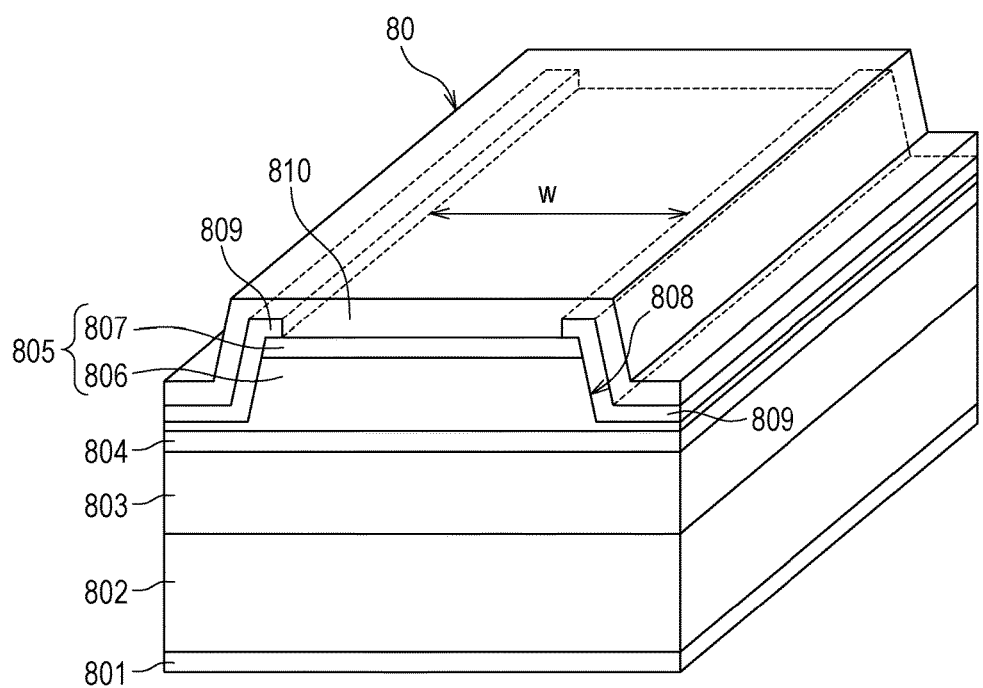
FIG. 8 is a perspective view schematically depicting a layered structure of a conventional end-face emission type semiconductor laser device.
Figure 9:
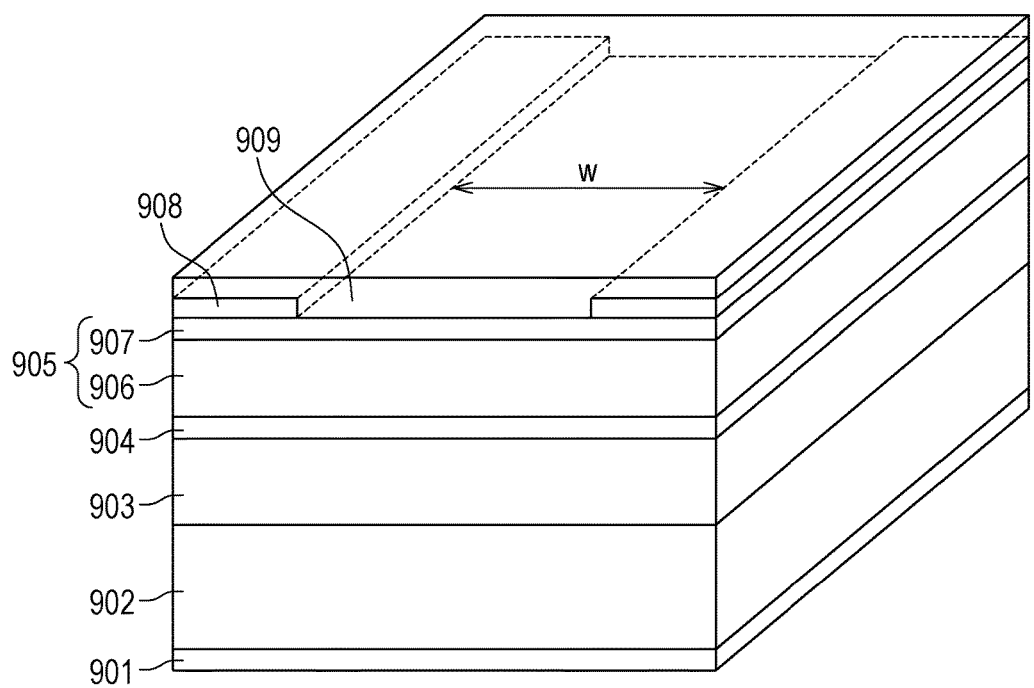
FIG. 9 is a perspective view schematically depicting another layered structure of a conventional end-face emission type semiconductor laser device.

FIG. 7 is a cross-sectional structural view of a semiconductor laser device 1b according to example 2.

In the semiconductor laser device 1b according to example 2, a multi-quantum well active layer 213 has a double quantum well layer structure configured of InGaAs/AlGaAs that emits infrared light having an oscillation wavelength of 905 nm. Furthermore, the semiconductor laser device 1b has a structure in which unit laser structures 200A, 200B, and 200C are laminated in a set of three, and was made by means of a similar method to that of the second embodiment.

Specifically, an n-type GaAs buffer layer 203 and an n-type $Al_{0.25}Ga_{0.75}As$ buffer layer 205 are laminated on an n-type electrode 233 and an n-type GaAs substrate 201 by means of the MOCVD method. Next, the unit laser structure 200A is laminated, which is configured of a first n-type cladding layer 209 configured of n-type $Al_{0.65}Ga_{0.35}As$ that is 1.5-µm thick, a second n-type cladding layer 211 configured of n-type $(Al_{0.50}Ga_{0.50})_{0.50}In_{0.50}P$ that is 1.0-µm thick, an InGaAs/AlGaAs multi-quantum well active layer 213, and a p-type cladding layer 217 configured of p-type $(Al_{0.50}Ga_{0.50})_{0.50}In_{0.50}P$ that is 2.5-nm thick.

Next, a tunnel junction layer 235A is laminated. This tunnel junction layer 235A has a layered structure in which GaAs that has been p-type doped at a high concentration and GaAs that has been n-type doped at a high concentration are sequentially laminated.

Continuing on from the tunnel junction layer 235A, the unit laser structure 200B, which is configured of the same laminated structure as the unit laser structure 200A, is laminated, and the unit laser structure 200C is laminated with a tunnel junction layer 235B interposed.

Thereafter, a p-type $Ga_{0.50}In_{0.50}P$ intermediate layer 225 and a p-type GaAs contact layer 227 are laminated. Furthermore, patterning is carried out leaving a stripe region having the stripe width w, and an insulating film 229 and a p-type electrode 231 are formed.

The multi-quantum well active layer 213 is configured of InGaAs/AlGaAs, and has a double quantum well layer structure made with a 25-nm undoped $Al_{0.3}Ga_{0.7}As$ optical guide layer, a 5-nm InGaAs quantum well layer, a 5-nm $Al_{0.3}Ga_{0.7}As$ barrier layer, a 5-nm In0.12Ga0.88As quantum well layer, and a 25-nm $Al_{0.3}Ga_{0.7}As$ optical guide layer being sequentially deposited. The multi-quantum well active layer 213 emits infrared light having an oscillation wavelength of 905 nm.

On the wafer after crystal growth, gain waveguide-type stripe structures having stripe widths w of 10 µm, 20 µm, 50 µm, 100 µm, and 200 µm were formed by means of a method similar to that of the second embodiment, cleaving was carried out at a resonator length of 600 µm and an end-face protective film was formed, and semiconductor laser devices 1b were made.

In example 2, a ridge stripe structure is not formed by means of etching, and therefore a GaInP etching stop layer is not laminated in the p-type cladding layer.

As comparative example 4 for this example 2, semiconductor laser devices were made with the stripe width w being 1 µm and 2 µm and the remaining configuration being similar to that of example 2.

Furthermore, as comparative example 5, semiconductor laser devices were made with the composition of the first n-type cladding layer being $(Al_{0.50}Ga_{0.50})_{0.50}In_{0.50}P$ and the remaining configuration being similar to that of example 2.

Furthermore, as comparative example 6, semiconductor laser devices that operate in a horizontal transverse single mode were made with the stripe width w being 1 µm and 2 µm and the composition of the first n-type cladding layer being $(Al_{0.50}Ga_{0.50})_{0.50}In_{0.50}P$, which is the same as that of comparative example 5.

When the device resistances in example 2, comparative example 4, comparative example 5, and comparative example 6 were measured, in a case where the stripe width w is 10 µm or more similar to example 1, a result was obtained in that the resistance value of example 2 in which the first n-type cladding layer is AlGaAs is less than the resistance values of comparative examples 1 to 3.

In example 2, a structure has been shown in which the unit laser structures 200A, 200B, and 200C having the same configuration are laminated in a set of three; however, this structure may be appropriately adjusted in such a way that the desired laser characteristics are obtained in each unit laser structure.

It is possible for the present disclosure to be suitably used in an apparatus or the like which employs a semiconductor laser device that emits high-output laser light. As an example, the present disclosure can be suitably used for applications or the like serving as a light source for a distance measurement system such as LiDAR or ToF (Time-of-Flight), an excitation light source for a fiber laser used for processing, or a light source such as a laser projector or a backlight.

The present disclosure contains subject matter related to that disclosed in Japanese Priority Patent Application JP 2017-205200 filed in the Japan Patent Office on Oct. 24, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser device comprising:
an n-type substrate;
a semiconductor laminated section in which an n-type cladding layer, an active layer, and a p-type cladding layer are sequentially laminated on the n-type substrate; and
a stripe structure on an upper section of the semiconductor laminated section,
wherein the n-type cladding layer has at least two layers that are:
a first n-type cladding layer configured of an $Al_{x1}Ga_{1-x1}As$ layer ($0.4<x1\leq1$), at a side distant from the active layer; and
a second n-type cladding layer configured of an $(Al_{x2}Ga_{1-x2})_{1-y2}In_{y2}P$ layer ($0\leq x2\leq1$, $0.45\leq y2\leq0.55$), at a side near to the active layer,
the p-type cladding layer is configured of an $(Al_{x3}Ga_{1-x3})_{1-y3}In_{y3}P$ layer ($0\leq x3\leq1$, $0.45\leq y3\leq0.55$), and
a width of the stripe structure is 10 μm or more, and a refractive index with respect to a laser oscillation wavelength of the first n-type cladding layer is less than or equal to a refractive index with respect to a laser oscillation wavelength of the second n-type cladding layer.

2. The semiconductor laser device according to claim 1, wherein, when a layer thickness of the first n-type cladding layer is taken as $t_{n1}$ and a layer thickness of the second n-type cladding layer is taken as $t_{n2}$, a relational expression $t_{n1}>t_{n2}$ is satisfied.

3. The semiconductor laser device according to claim 1, wherein, when a refractive index with respect to an oscillation wavelength of the p-type cladding layer is taken as $n_p$, a refractive index with respect to an oscillation wavelength of the first n-type cladding layer is taken as $n_{n1}$, a layer thickness of the first n-type cladding layer is taken as $t_{n1}$, a refractive index with respect to an oscillation wavelength of the second n-type cladding layer is taken as $n_{n2}$, and a layer thickness of the second n-type cladding layer is taken as $t_{n2}$, a relational expression $n_p<[\{(n_{n1}\times t_{n1})+(n_{n2}\times t_{n2})\}/(t_{n1}+t_{n2})]$ is satisfied.

4. The semiconductor laser device according to claim 1, wherein the active layer includes at least one quantum well, and has an oscillation wavelength that is greater than or equal to 600 nm and less than or equal to 1100 nm.

5. The semiconductor laser device according to claim 1, wherein the semiconductor laminated section includes, in the following order:
the n-type cladding layer;
the active layer; and
the p-type cladding layer configured of the $(Al_{x3}Ga_{1-x3})_{1-y3}In_{y3}P$ layer ($0\leq x3\leq1$, $0.45\leq y3\leq0.55$),
the n-type cladding layer is provided with a laminated body including:
the first n-type cladding layer configured of the $Al_{x1}Ga_{1-x1}As$ layer ($0.4<x1\leq1$), at the side distant from the active layer; and
the second n-type cladding layer configured of the $(Al_{x2}Ga_{1-x2})_{1-y2}In_{y2}P$ layer ($0\leq x2\leq1$, $0.45\leq y2\leq0.55$), at the side near to the active layer, and
the laminated body is laminated in plurality with a tunnel junction layer interposed.

\* \* \* \* \*